US012316218B2

(12) United States Patent
Chen

(10) Patent No.: US 12,316,218 B2
(45) Date of Patent: May 27, 2025

(54) POWER CONVERTER HAVING CHARGE PUMP FREQUENCY SWITCHING CONTROL MECHANISM

(71) Applicant: ANPEC ELECTRONICS CORPORATION, Hsinchu (TW)

(72) Inventor: Kun-Min Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 122 days.

(21) Appl. No.: 18/363,690

(22) Filed: Aug. 1, 2023

(65) Prior Publication Data

US 2024/0380318 A1    Nov. 14, 2024

(30) Foreign Application Priority Data

May 8, 2023   (TW) .................................. 112116925

(51) Int. Cl.
*H02M 3/07*    (2006.01)
*H02M 1/00*    (2006.01)
*H03K 17/041*  (2006.01)

(52) U.S. Cl.
CPC ........... *H02M 3/07* (2013.01); *H02M 1/0025* (2021.05); *H03K 17/04106* (2013.01); *H03K 2217/0063* (2013.01)

(58) Field of Classification Search
CPC .... H02M 3/07; H02M 1/0025; H02M 1/0006; H02M 1/08; H03K 17/04106; H03K 2217/0063
See application file for complete search history.

(56) References Cited

U.S. PATENT DOCUMENTS

| | | | | |
|---|---|---|---|---|
| 8,970,185 | B1* | 3/2015 | Sutardja | H02M 1/08 323/266 |
| 11,196,339 | B1* | 12/2021 | Jodka | H02M 1/08 |
| 2015/0311884 | A1* | 10/2015 | Saadat | H03K 3/012 327/109 |
| 2024/0313631 | A1* | 9/2024 | Ni | H02M 1/0048 |

* cited by examiner

*Primary Examiner* — Sibin Chen
(74) *Attorney, Agent, or Firm* — Li & Cai Intellectual Property Office

(57) ABSTRACT

A power converter having a charge pump frequency switching control mechanism is provided. In the power converter, frequencies of a plurality of pulse waves of a clock signal are determined, according to a level of a high-side control signal outputted to a control terminal of a high-side switch from a control circuit or a voltage of the control terminal (and a voltage of a second terminal) of the high-side switch. In the power converter, a charge pump supplies power to a high-side driver circuit at the frequencies of the clock signal, and the high-side driver circuit uses the power from the charge pump to drive the high-side switch and to pull up the voltage of the control terminal of the high-side switch.

11 Claims, 5 Drawing Sheets

POWER CONVERTER HAVING CHARGE PUMP FREQUENCY SWITCHING CONTROL MECHANISM

CROSS-REFERENCE TO RELATED PATENT APPLICATION

This application claims the benefit of priority to Taiwan Patent Application No. 112116925, filed on May 8, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a power converter, and more particularly to a power converter having a charge pump frequency switching control mechanism.

BACKGROUND OF THE DISCLOSURE

Power converters are indispensable for external electronic devices. The power converters are used for adjusting power and supplying the adjusted power to the external electronic devices. In the power converter, a charge pump supplies power to a high-side driver circuit, and the high-side driver circuit uses the power from the charge pump to drive a high-side switch according to a control signal from a control circuit.

However, in the power converter, the charge pump always charges the high-side driver circuit at a fixed frequency. If the charge pump of the power converter is set to supply power to the high-side driver circuit at a low fixed frequency, the high-side driver circuit is unable to quickly drive the high-side switch for pulling up a voltage of the high-side switch. Conversely, if the charge pump of the power converter is set to supply power to the high-side driver circuit at a high fixed frequency, the high-side driver circuit switches the high-side switch at a high frequency for a long period of time for quickly pulling up the voltage of the high-side switch, which causes electromagnetic interference (EMI).

SUMMARY OF THE DISCLOSURE

In response to the above-referenced technical inadequacies, the present disclosure provides a power converter having a charge pump frequency switching control mechanism. The power converter includes a high-side switch, a low-side switch, a control circuit, a low-side driver circuit, a high-side driver circuit, a pulse signal generator circuit, a clock generator circuit and a charge pump. A first terminal of the high-side switch is connected to an input voltage source. A first terminal of the low-side switch is connected to a second terminal of the high-side switch. A second terminal of the low-side switch is grounded. The control circuit is configured to output a high-side control signal and a low-side control signal. The low-side driver circuit is connected to a control terminal of the low-side switch and the control circuit. The low-side driver circuit is configured to output a low-side driving signal to the control terminal of the low-side switch according to the low-side control signal from the control circuit. The high-side driver circuit is connected to a control terminal of the high-side switch and the control circuit. The high-side driver circuit is configured to output a high-side driving signal to the control terminal of the high-side switch according to the high-side control signal from the control circuit. The pulse signal generator circuit is connected to the control circuit. The pulse signal generator circuit is configured to determine whether to generate a pulse wave in a high-side pulse enable signal according to a level of the high-side control signal from the control circuit. The pulse signal generator circuit is configured to output the high-side pulse enable signal. The clock generator circuit is connected to the pulse signal generator circuit. The clock generator circuit is configured to determine whether or not the pulse wave is in the high-side pulse enable signal to determine a frequency of a clock signal. The clock generator circuit is configured to output the clock signal. The charge pump is connected to the pulse signal generator circuit and the high-side driver circuit. The charge pump determines a frequency of supplying power to the high-side driver circuit according to the frequency of the clock signal from the clock generator circuit. The charge pump charges the high-side driver circuit to supply the power required for the high-side driver circuit to drive the high-side switch and to pull up a voltage of the control terminal of the high-side switch.

In certain embodiments, the charge pump outputs a charging signal to the high-side driver circuit. The high-side driver circuit uses power of the charging signal from the charge pump to pull up the voltage of the control terminal of the high-side switch from an initial voltage to be higher than an input voltage of the input voltage source and to reach a voltage of the charging signal.

In certain embodiments, when the control circuit outputs the high-side control signal at a low level respectively to the pulse signal generator circuit and the high-side driver circuit, the pulse signal generator circuit outputs the high-side pulse enable signal at a low level to the clock generator circuit according to the high-side control signal at the low level. The clock generator circuit outputs the clock signal having a low frequency to the charge pump according to the high-side pulse enable signal at the low level.

In certain embodiments, when the control circuit outputs the high-side control signal at a high level respectively to the pulse signal generator circuit and the high-side driver circuit, the pulse signal generator circuit outputs the high-side pulse enable signal having the pulse wave to the clock generator circuit according to the high-side control signal at the high level. The clock generator circuit outputs the clock signal having a high frequency to the charge pump according to the high-side pulse enable signal having the pulse wave.

In certain embodiments, the frequency of the clock signal that is outputted by the clock generator circuit within time other than a working period of the pulse wave of the high-side pulse enable signal is equal to a first reference frequency. The frequency of the clock signal that is outputted by the clock generator circuit within the working period of the pulse wave of the high-side pulse enable signal is equal to a second reference frequency. The second reference frequency is higher than the first reference frequency.

In certain embodiments, the charge pump includes a first capacitor. A first terminal of the first capacitor is connected to the input voltage source and the high-side driver circuit. A second terminal of the first capacitor is grounded.

In certain embodiments, the charge pump further includes a second capacitor. A first terminal of the second capacitor is connected to the input voltage source. A second terminal of the second capacitor is connected to the first terminal of the first capacitor.

In certain embodiments, the charge pump further includes a first switch component. A first terminal of the first switch component is connected to the input voltage source. A second terminal of the first switch component is connected to the first terminal of the second capacitor. A control terminal of the first switch component is connected to an output terminal of the clock generator circuit.

In certain embodiments, the charge pump further includes a second switch component. A first terminal of the second switch component is connected to the second terminal of the second capacitor. A second terminal of the second switch component is connected to the first terminal of the first capacitor. A control terminal of the second switch component is connected to the output terminal of the clock generator circuit.

In certain embodiments, the charge pump further includes a third switch component. A first terminal of the third switch component is connected to the input voltage source. A second terminal of the third switch component is connected to the second terminal of the second capacitor. A control terminal of the third switch component is connected to the output terminal of the clock generator circuit.

In certain embodiments, the charge pump further includes a fourth switch component. A first terminal of the fourth switch component is connected to the first terminal of the second capacitor. A second terminal of the fourth switch component is coupled to a reference voltage. A control terminal of the fourth switch component is connected to the output terminal of the clock generator circuit.

In addition, the present disclosure provides a power converter having a charge pump frequency switching control mechanism. The power converter includes a high-side switch, a low-side switch, a control circuit, a low-side driver circuit, a high-side driver circuit, a high-side switch detecting circuit, a clock generator circuit and a charge pump. A first terminal of the high-side switch is connected to an input voltage source. A first terminal of the low-side switch is connected to a second terminal of the high-side switch. A second terminal of the low-side switch is grounded. A control circuit is configured to output a high-side control signal and a low-side control signal. The low-side driver circuit is connected to a control terminal of the low-side switch and the control circuit. The low-side driver circuit is configured to output a low-side driving signal to the control terminal of the low-side switch according to the low-side control signal from the control circuit. The high-side driver circuit is connected to a control terminal of the high-side switch and the control circuit. The high-side driver circuit is configured to output a high-side driving signal to the control terminal of the high-side switch according to the high-side control signal from the control circuit. The high-side switch detecting circuit is connected to the control terminal of the high-side switch. The high-side switch detecting circuit is configured to detect a voltage of the control terminal of the high-side switch to output a high-side control detected signal. The clock generator circuit is connected to the high-side switch detecting circuit. The clock generator circuit is configured to determine a frequency of a clock signal according to the high-side control detected signal from the high-side switch detecting circuit. The clock generator circuit is configured to output the clock signal. The charge pump is connected to the pulse signal generator circuit and the high-side driver circuit. The charge pump determines a frequency of supplying power to the high-side driver circuit according to the frequency of the clock signal from the clock generator circuit. The charge pump charges the high-side driver circuit to supply the power required for the high-side driver circuit to drive the high-side switch and to pull up the voltage of the control terminal of the high-side switch.

In certain embodiments, when the high-side switch detecting circuit determines that the voltage of the control terminal of the high-side switch reaches a target voltage, the clock generator circuit reduces the frequency of the clock signal outputted to the charge pump.

In certain embodiments, the charge pump outputs a charging signal to the high-side driver circuit, the high-side driver circuit uses power of the charging signal to pull up the voltage of the control terminal of the high-side switch to the target voltage. The high-side switch detecting circuit sets the target voltage to be equal to a voltage of the charging signal.

In certain embodiments, the charge pump outputs a charging signal to the high-side driver circuit. The high-side driver circuit uses power of the charging signal to pull up the voltage of the control terminal of the high-side switch to the target voltage. The high-side switch detecting circuit sets a difference between the target voltage and a voltage of the charging signal to be lower than a voltage difference threshold.

In certain embodiments, the high-side switch detecting circuit detects a voltage of the second terminal of the high-side switch. The high-side switch detecting circuit calculates a difference between the voltage of the control terminal of the high-side switch and the voltage of the second terminal of the high-side switch to output the high-side control detected signal.

In certain embodiments, when the high-side switch detecting circuit determines that the difference between the voltage of the control terminal of the high-side switch and the voltage of the second terminal of the high-side switch reaches a target voltage, the clock generator circuit reduces the frequency of the clock signal outputted to the charge pump according to the high-side control detected signal from the high-side switch detecting circuit.

As described above, the present disclosure provides the power converter having the charge pump frequency switching control mechanism. In the power converter of the present disclosure, the frequency of the clock signal outputted to the charge pump is adjusted to switch the frequency of charging the high-side driver circuit by the charge pump. For example, when the high-side driver circuit drives the high-side switch and pulls up the voltage of the control terminal of the high-side switch according to the high-side control signal from the control circuit, the high-side driver circuit switches the frequency of the clock signal outputted to the charge pump to be the high frequency. The charge pump quickly supplies power to the high-side driver circuit according to the clock signal having the high frequency. As a result, the voltage of the control terminal of the high-side switch is quickly pulled up to the target voltage by the high-side driver circuit of the power converter of the present disclosure. After the voltage of the control terminal of the high-side switch is pulled up to the target voltage, the high-side driver circuit of the power converter of the present disclosure switches the frequency of the clock signal outputted to the charge pump back to the low frequency so as to reduce a time length of time during which the high-side switch is switched at the high frequency, thereby preventing electromagnetic interference (EMI) from being generated.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
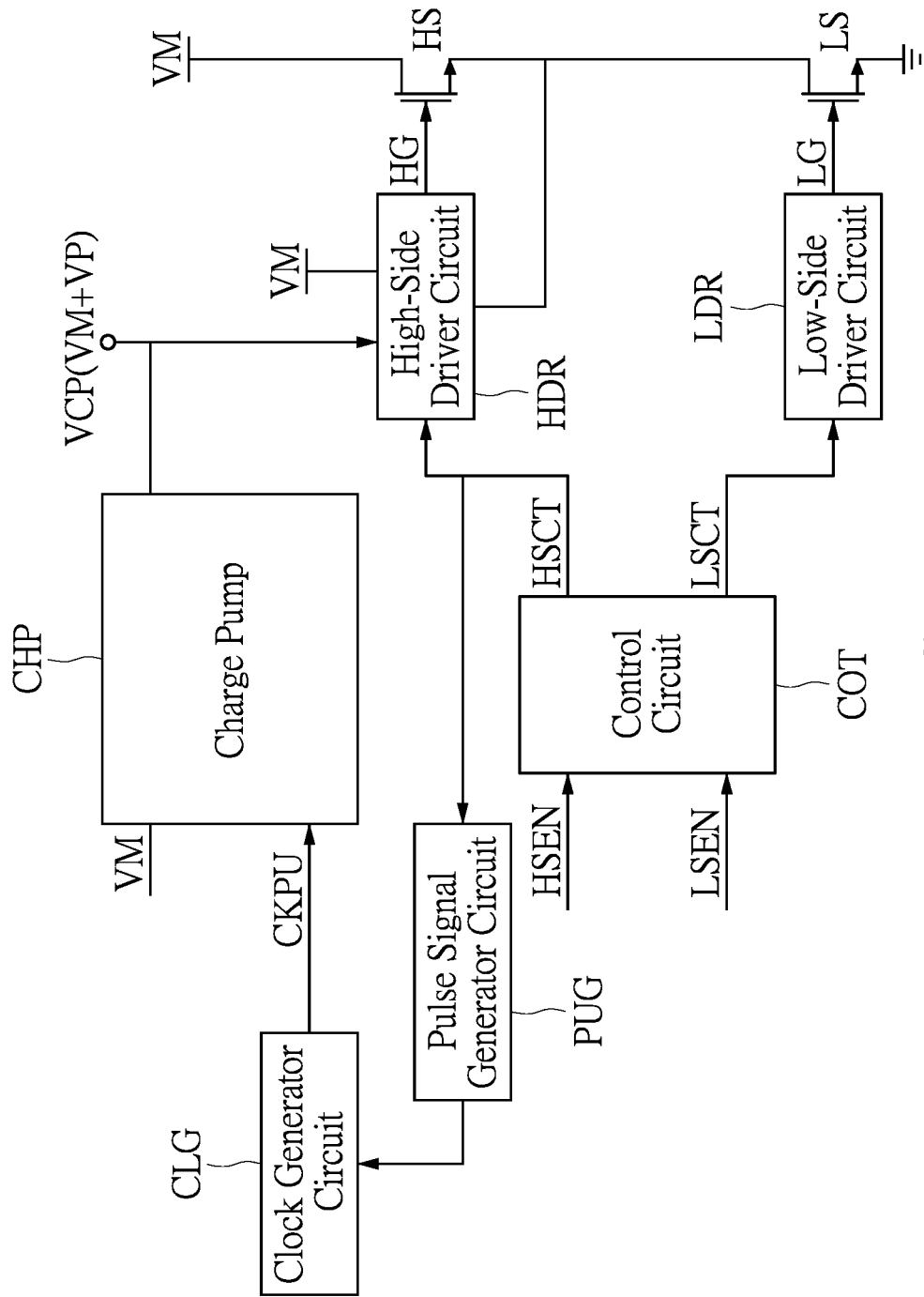
FIG. 1 is a circuit diagram of a power converter having a charge pump frequency switching control mechanism according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 3:
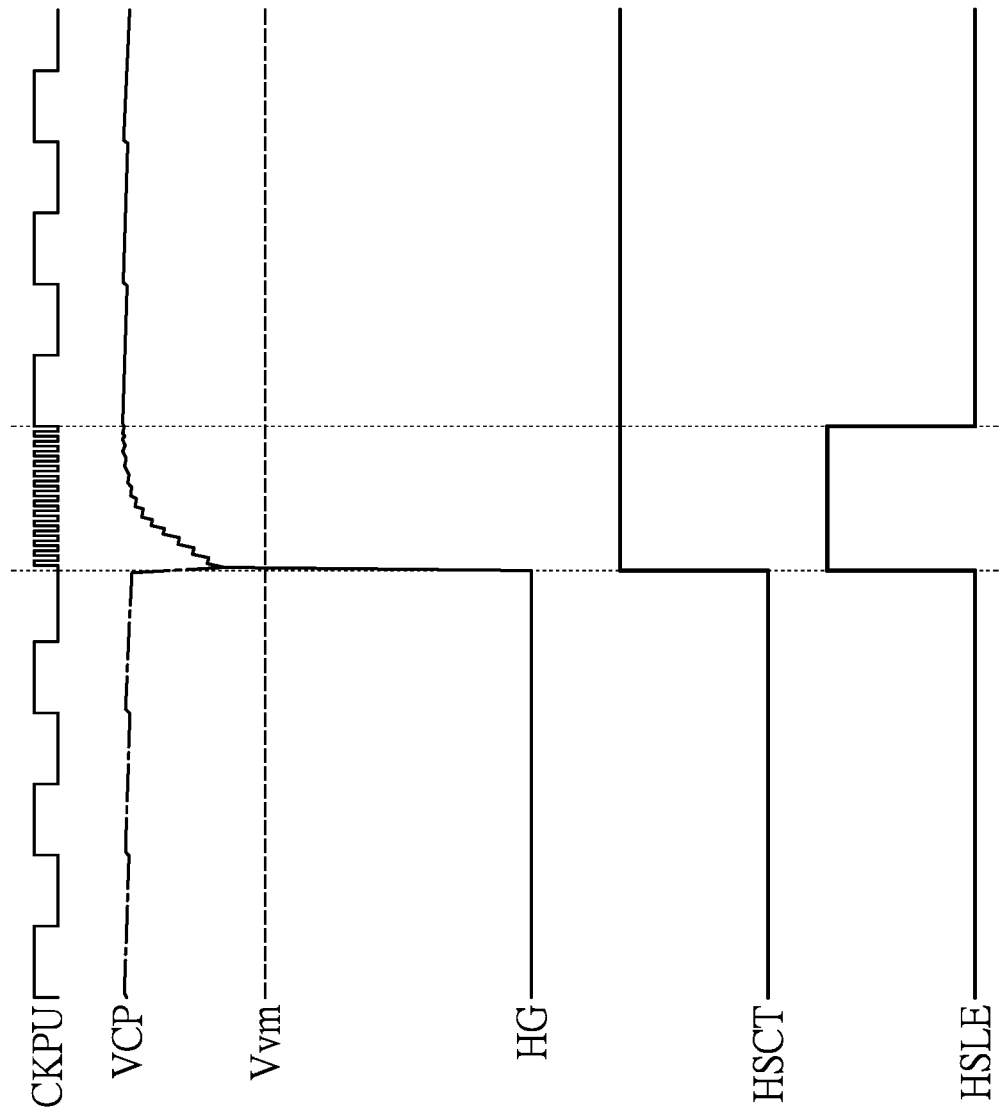
FIG. 3 is a waveform diagram of signals of the power converter having the charge pump frequency switching control mechanism according to the first and second embodiments of the present disclosure.

Reference is made to FIGS. 1 and 3, in which FIG. 1 is a circuit diagram of a power converter having a charge pump frequency switching control mechanism according to a first embodiment of the present disclosure, and FIG. 3 is a waveform diagram of signals of the power converter having the charge pump frequency switching control mechanism according to the first and second embodiments of the present disclosure.

As shown in FIG. 1, in first embodiment of the present disclosure, the power converter includes a high-side switch HS, a low-side switch LS, a control circuit COT, a low-side driver circuit LDR, a high-side driver circuit HDR, a pulse signal generator circuit PUG, a clock generator circuit CLG and a charge pump CHP.

A first terminal of the high-side switch HS is connected to an input voltage source VM. A first terminal of the low-side switch LS is connected to a second terminal of the high-side switch HS. A second terminal of the low-side switch LS is grounded. The low-side driver circuit LDR is connected to a control terminal of the low-side switch LS. The high-side driver circuit HDR is connected to a control terminal of the high-side switch HS and the control circuit COT.

The control circuit COT is connected to the pulse signal generator circuit PUG. The pulse signal generator circuit PUG is connected to the clock generator circuit CLG. The charge pump CHP is connected to the clock generator circuit CLG and the high-side driver circuit HDR.

The control circuit COT outputs a high-side control signal HSCT (according to a high-side control enable signal HSEN from an external main control enabling circuit). The control circuit COT outputs a low-side control signal LSCT (according to a low-side control enable signal LSEN from the external main control enabling circuit). The low-side driver circuit LDR outputs a low-side driving signal LG to the control terminal of the low-side switch LS according to the low-side control signal LSCT from the control circuit COT.

It is worth noting that, the pulse signal generator circuit PUG determines whether to generate a pulse wave in a high-side pulse enable signal according to a level of the high-side control signal HSCT from the control circuit COT. The pulse signal generator circuit PUG outputs the high-side pulse enable signal.

The clock generator circuit CLG determines whether or not the pulse wave is in the high-side pulse enable signal from the pulse signal generator circuit PUG to determine a frequency of a clock signal CKPU. The clock generator circuit CLG outputs the clock signal CKPU to the charge pump CHP.

The charge pump CHP determines a frequency of supplying power to the high-side driver circuit HDR according to the frequency of the clock signal CKPU from the clock generator circuit CLG. The charge pump CHP charges the high-side driver circuit HDR to supply the power required for the high-side driver circuit HDR to drive the high-side switch HS.

For example, as shown in FIG. 3, when the control circuit COT outputs the high-side control signal HSCT at a low level, the pulse signal generator circuit PUG outputs the high-side pulse enable signal at a low level (that is, the high-side pulse enable signal does not have the pulse wave) according to the high-side control signal HSCT at the low level. At this time, the clock generator circuit CLG outputs the clock signal CKPU having a first reference frequency (that is a low frequency) to the charge pump CHP according to the high-side pulse enable signal at the low level from the pulse signal generator circuit PUG. As a result, the charge pump CHP slowly supplies power to the high-side driver circuit HDR according to the clock signal CKPU having the first reference frequency (that is the low frequency).

It is worth noting that, as shown in FIG. 3, when the control circuit COT outputs the high-side control signal HSCT at a high level, the pulse signal generator circuit PUG outputs a high-side pulse enable signal HSLE having the pulse wave (that is the high-side pulse enable signal at a high level) according to the high-side control signal HSCT at the high level from the control circuit COT. At this time, the clock generator circuit CLG outputs the clock signal CKPU having a second reference frequency (that is a high frequency) to the charge pump CHP according to the high-side pulse enable signal HSLE having the pulse wave (that is the high-side pulse enable signal at the high level). The charge pump CHP quickly supplies power to the high-side driver circuit HDR according to the clock signal CKPU having the second reference frequency (that is the high frequency). As a result, the high-side driver circuit HDR is able to use the power supplied by the charge pump CHP to quickly drive and switch the high-side switch HS so as to quickly pull up a voltage of the control terminal of the high-side switch HS from an initial voltage to a target voltage.

For example, the second reference frequency described herein is twice the first reference frequency or is more than twice the first reference frequency, but the present disclosure is not limited thereto.

For example, the charge pump CHP outputs a charging signal to the high-side driver circuit HDR, and the high-side driver circuit HDR uses power of the charging signal to pull up the voltage of the control terminal of the high-side switch HS from the initial voltage to be higher than an input voltage Vvm of the input voltage source VM and to be equal to a charging voltage VCP of the charging signal, within working periods of (one or) more of a plurality of pulse waves of the clock signal CKPU at a high frequency (and within a working period of the high-side control enable signal HSEN) as shown in FIG. 3.

Types of the high-side switch HS and the low-side switch LS of the power converter of the present disclosure are shown in FIG. 1, but the present disclosure is not limited thereto. If the type of the high-side switch HS in practice is different from that shown in FIG. 1, a level of a high-side driving signal HG outputted to the high-side switch HS by the high-side driver circuit HDR for turning on or off the high-side switch HS is different from that in the first embodiment. For example, the high-side driver circuit HDR may output the high-side driving signal HG at a low level to the high-side switch HS for turning on the high-side switch HS in practice. In practice, if the type of the low-side switch LS is different from that shown in FIG. 1, a level of a low-side driving signal LG outputted to the low-side switch LS by the low-side driver circuit LDR for turning on or off the low-side switch LS is different from that in the first embodiment. For example, the low-side driver circuit LDR may output the low-side driving signal LG at a low level to the low-side switch LS for turning on the low-side switch LS in practice.

Figure 2:
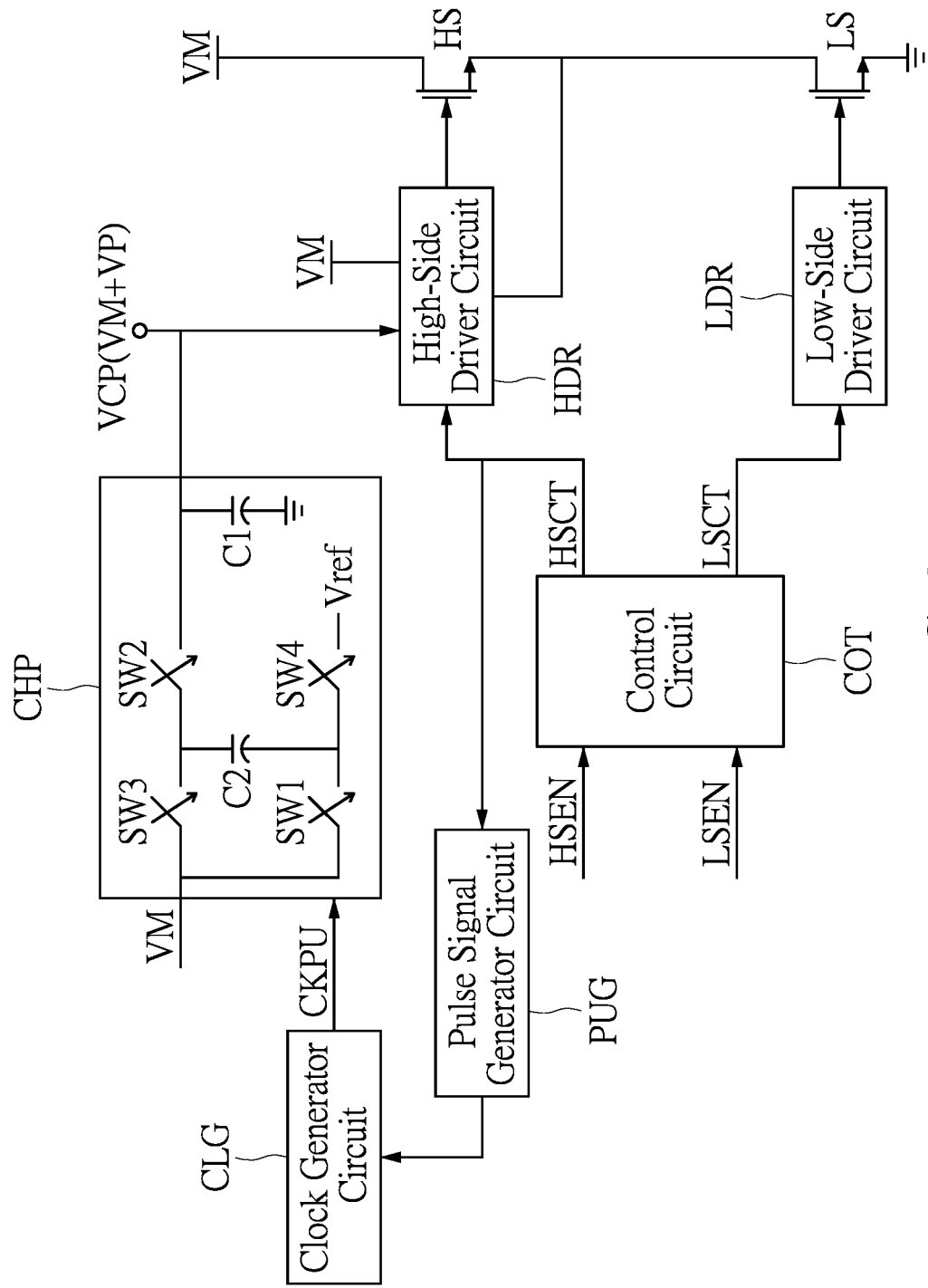
FIG. 2 is a circuit diagram of a power converter having a charge pump frequency switching control mechanism according to a second embodiment of the present disclosure.

Reference is made to FIG. 2, which is a circuit diagram of a power converter having a charge pump frequency switching control mechanism according to a second embodiment of the present disclosure. The descriptions of the second embodiment of the present disclosure that are the same as the descriptions of the first embodiment of the present disclosure are not repeated herein.

In the second embodiment of the present disclosure, the charge pump CHP of the power converter includes a first capacitor C1, a second capacitor C2, a first switch component SW1, a second switch component SW2, a third switch component SW3 and a fourth switch component SW4.

A first terminal of the first switch component SW1 is connected to the input voltage source VM. A second terminal of the first switch component SW1 is connected to a first terminal of the second capacitor C2. A second terminal of the second capacitor C2 is connected to a first terminal of the second switch component SW2. A second terminal of the second switch component SW2 is connected to a first terminal of the first capacitor C1. A second terminal of the first capacitor C1 is grounded.

A first terminal of the third switch component SW3 is connected to the input voltage source VM. A second terminal of the third switch component SW3 is connected to the second terminal of the second capacitor C2 and the first terminal of the second switch component SW2.

A first terminal of the fourth switch component SW4 is connected to the first terminal of the second capacitor C2. A second terminal of the fourth switch component SW4 is coupled to a reference voltage Vref.

It is worth noting that, a control terminal of the first switch component SW1, a control terminal of the second switch component SW2, a control terminal of the third switch component SW3 and a control terminal of the fourth switch component SW4 are connected to an output terminal of the clock generator circuit CLG. The high-side driver circuit HDR is connected to the first terminal of the first capacitor C1 and the second terminal of the second switch component SW2.

The clock generator circuit CLG outputs the clock signal CKPU respectively to the control terminal of the first switch component SW1, the control terminal of the second switch component SW2, the control terminal of the third switch component SW3, and the control terminal of the fourth switch component SW4.

The first switch component SW1, the second switch component SW2, the third switch component SW3 and the fourth switch component SW4 of the charge pump CHP operate according to a frequency of the clock signal CKPU from the clock generator circuit CLG for controlling a frequency that the first capacitor C1 and the second capacitor C2 of the charge pump CHP are charged. Under this condition, the frequency that the charge pump CHP supplies the charging signal to the high-side driver circuit HDR, and the frequency that the high-side driver circuit HDR uses the charging voltage VCP of the charging signal to drive and switch the high-side switch HS for pulling up the voltage of the control terminal of the high-side switch HS, depend on the frequency of the clock signal CKPU.

Figure 4:
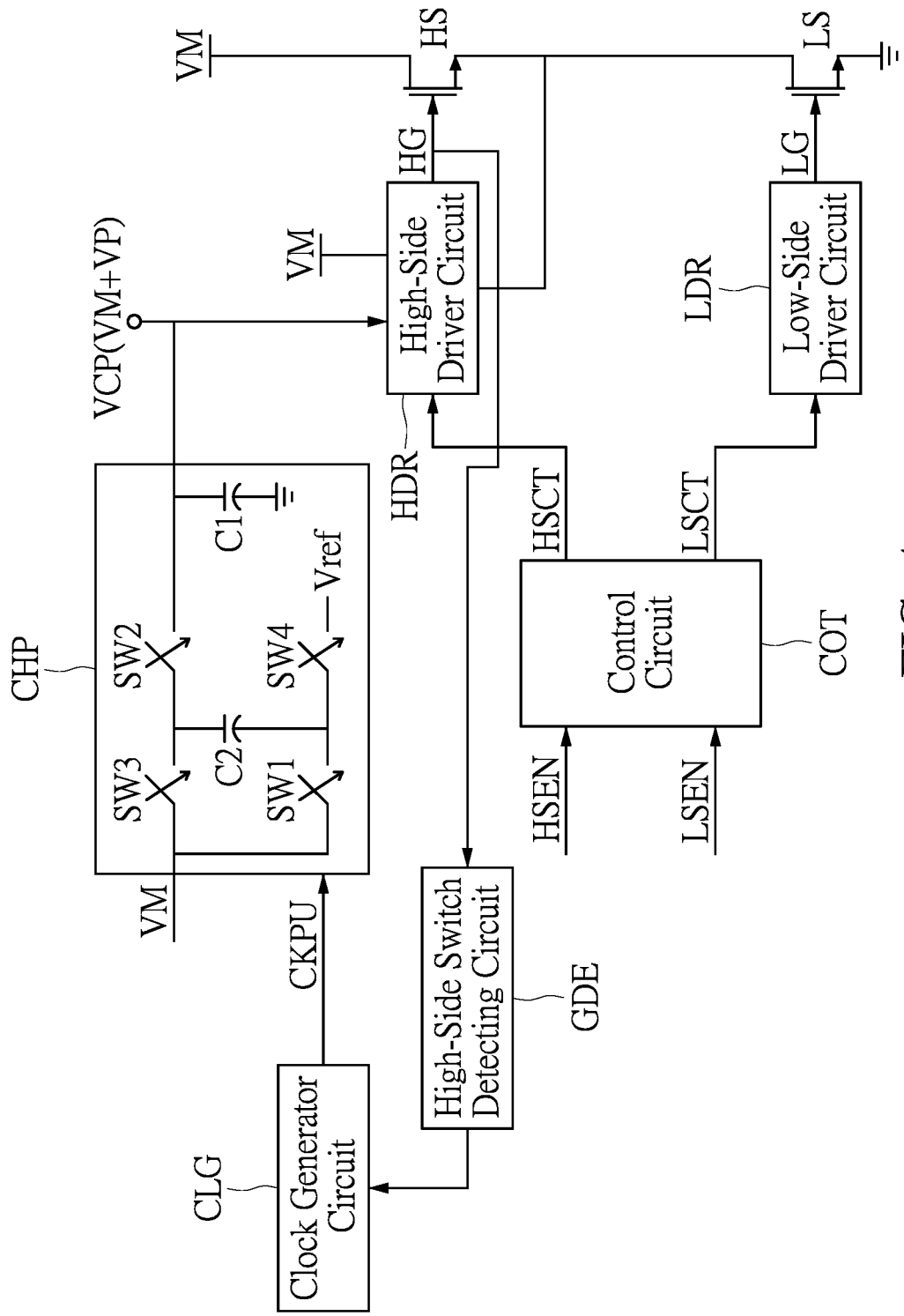
FIG. 4 is a circuit diagram of a power converter having a charge pump frequency switching control mechanism according to a third embodiment of the present disclosure.

Reference is made to FIG. 4, which is a circuit diagram of a power converter having a charge pump frequency switching control mechanism according to a third embodiment of the present disclosure. The descriptions of the third embodiment of the present disclosure that are the same as the descriptions of the first and second embodiment of the present disclosure are not repeated herein.

A difference between the third and second embodiments of the present disclosure is that, the power converter of the second embodiment includes the pulse signal generator circuit PUG as shown in FIG. 2, but the power converter of the third embodiment includes a high-side switch detecting circuit GDE instead of the pulse signal generator circuit PUG as shown in FIG. 4.

If necessary, the power converter of the present disclosure may include both of the pulse signal generator circuit PUG and the high-side switch detecting circuit GDE in practice.

As shown in FIG. 4, in the third embodiment, the high-side switch detecting circuit GDE is connected to the control terminal of the high-side switch HS and the clock generator circuit CLG.

The high-side switch detecting circuit GDE detects the voltage of the control terminal (such as a gate terminal) of the high-side switch HS to output a high-side control detected signal.

The clock generator circuit CLG determines the frequency of the clock signal CKPU according to the voltage of the control terminal (such as the gate terminal) of the high-side switch HS that is indicated by the high-side control detected signal from the high-side switch detecting circuit GDE. The clock generator circuit CLG outputs the clock signal CKPU.

The charge pump CHP determines the frequency of supplying power to the high-side driver circuit HDR according to the frequency of the clock signal CKPU from the clock generator circuit CLG.

When the high-side switch detecting circuit GDE determines that the voltage of the control terminal of the high-side switch HS reaches the target voltage, the clock generator circuit CLG reduces the frequency of the clock signal CLG outputted to the charge pump CHP. For example, the target voltage is equal to the charging voltage VCP of the charging signal that is outputted to the high-side driver circuit HDR by the charge pump CHP, and is equal to a sum of the input voltage of the input voltage source VM and a preset voltage VP (such as, but not limited to 5V).

Alternatively, when the high-side switch detecting circuit GDE determines that a difference between the voltage of the control terminal of the high-side switch HS and the target voltage is lower than a voltage difference threshold, the clock generator circuit CLG reduces the frequency of the clock signal CLG outputted to the charge pump CHP. As a result, the charge pump CHP reduces the frequency of supplying power to the high-side driver circuit HDR so as to reduce the speed that the high-side driver circuit HDR uses the power supplied by the charge pump CHP to switch the high-side switch HS, thereby reducing electromagnetic interference (EMI).

Figure 5:
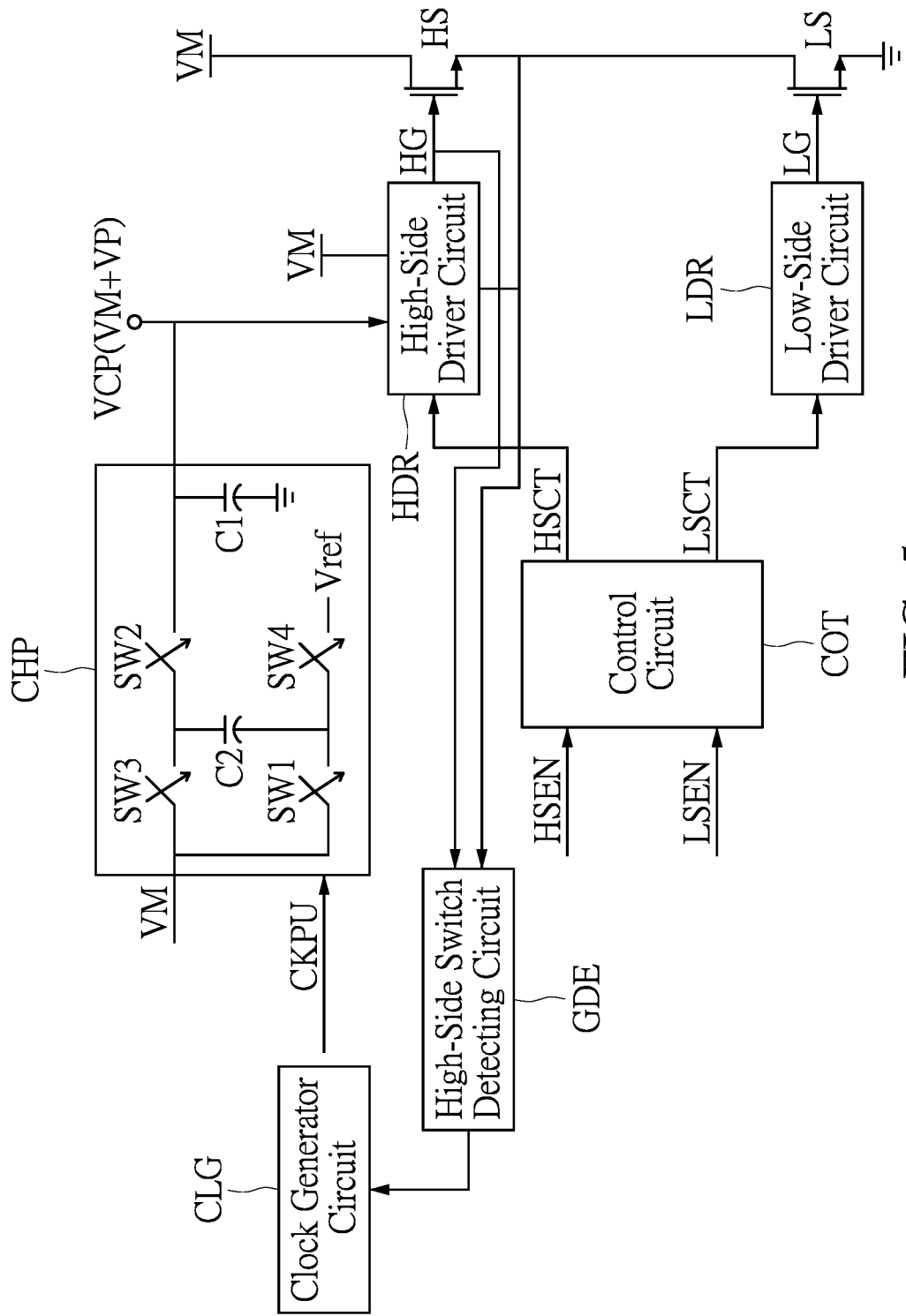
FIG. 5 is a circuit diagram of a power converter having a charge pump frequency switching control mechanism according to a fourth embodiment of the present disclosure.

Reference is made to FIG. 5, which is a circuit diagram of a power converter having a charge pump frequency switching control mechanism according to a fourth embodiment of the present disclosure. The descriptions of the fourth embodiment of the present disclosure that are the same as the descriptions of the third embodiment of the present disclosure are not repeated herein.

The high-side switch detecting circuit GDE not only detects the voltage of the control terminal (such as the gate terminal) of the high-side switch HS, but also detects a voltage of the second terminal (such as a source terminal) of the high-side switch HS.

The high-side switch detecting circuit GDE calculates a difference between the voltage of the control terminal (such as the gate terminal) of the high-side switch HS and the voltage of the second terminal (such as the source terminal) of the high-side switch HS to output the high-side control detected signal.

When the high-side switch detecting circuit GDE determines that the difference between the voltage of the control terminal (such as the gate terminal) of the high-side switch HS and the voltage of the second terminal (such as the source terminal) of the high-side switch HS reaches the target voltage (such as, but not limited to 5V), the clock generator circuit CLG reduces the frequency of the clock signal CKPU outputted to the charge pump CHP according to the high-side control detected signal from the high-side switch detecting circuit GDE. As a result, the charge pump CHP reduces the frequency of supplying power to the high-side driver circuit HDR so as to reduce the speed that the high-side driver circuit HDR uses the power supplied by the charge pump CHP to switch the high-side switch HS, thereby reducing electromagnetic interference (EMI).

In conclusion, the present disclosure provides the power converter having the charge pump frequency switching control mechanism. In the power converter of the present disclosure, the frequency of the clock signal outputted to the charge pump is adjusted to switch the frequency of charging the high-side driver circuit by the charge pump. For example, when the high-side driver circuit drives the high-side switch and pulls up the voltage of the control terminal of the high-side switch according to the high-side control signal from the control circuit, the high-side driver circuit switches the frequency of the clock signal outputted to the charge pump to be the high frequency. The charge pump quickly supplies power to the high-side driver circuit according to the clock signal having the high frequency. As a result, the voltage of the control terminal of the high-side switch is quickly pulled up to the target voltage by the high-side driver circuit of the power converter of the present disclosure. After the voltage of the control terminal of the high-side switch is pulled up to the target voltage, the high-side driver circuit of the power converter of the present disclosure switches the frequency of the clock signal outputted to the charge pump back to the low frequency so as to reduce a time length of time during which the high-side switch is switched at the high frequency, thereby preventing the electromagnetic interference (EMI) from being generated.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power converter having a charge pump frequency switching control mechanism, comprising:
   a high-side switch, wherein a first terminal of the high-side switch is connected to an input voltage source;
   a low-side switch, wherein a first terminal of the low-side switch is connected to a second terminal of the high-side switch, and a second terminal of the low-side switch is grounded;
   a control circuit configured to output a high-side control signal and a low-side control signal;
   a low-side driver circuit connected to a control terminal of the low-side switch and the control circuit, and configured to output a low-side driving signal to the control terminal of the low-side switch according to the low-side control signal from the control circuit;
   a high-side driver circuit connected to a control terminal of the high-side switch and the control circuit, and configured to output a high-side driving signal to the control terminal of the high-side switch according to the high-side control signal from the control circuit;
a pulse signal generator circuit connected to the control circuit, configured to determine whether to generate a pulse wave in a high-side pulse enable signal according to a level of the high-side control signal from the control circuit, and configured to output the high-side pulse enable signal;
a clock generator circuit connected to the pulse signal generator circuit, configured to determine whether or not the pulse wave is in the high-side pulse enable signal to determine a frequency of a clock signal, and configured to output the clock signal; and
a charge pump connected to the clock generator circuit and the high-side driver circuit, wherein the charge pump determines a frequency of supplying power to the high-side driver circuit according to the frequency of the clock signal from the clock generator circuit, and the charge pump charges the high-side driver circuit to supply the power required for the high-side driver circuit to drive the high-side switch and to pull up a voltage of the control terminal of the high-side switch.

2. The power converter according to claim 1, wherein the charge pump outputs a charging signal to the high-side driver circuit, the high-side driver circuit uses power of the charging signal from the charge pump to pull up the voltage of the control terminal of the high-side switch from an initial voltage to be higher than an input voltage of the input voltage source and to reach a voltage of the charging signal.

3. The power converter according to claim 1, wherein, when the control circuit outputs the high-side control signal at a low level respectively to the pulse signal generator circuit and the high-side driver circuit, the pulse signal generator circuit outputs the high-side pulse enable signal at a low level to the clock generator circuit according to the high-side control signal at the low level, and the clock generator circuit outputs the clock signal having a low frequency to the charge pump according to the high-side pulse enable signal at the low level.

4. The power converter according to claim 3, wherein, when the control circuit outputs the high-side control signal at a high level respectively to the pulse signal generator circuit and the high-side driver circuit, the pulse signal generator circuit outputs the high-side pulse enable signal having the pulse wave to the clock generator circuit according to the high-side control signal at the high level, and the clock generator circuit outputs the clock signal having a high frequency to the charge pump according to the high-side pulse enable signal having the pulse wave.

5. The power converter according to claim 1, wherein, the frequency of the clock signal that is outputted by the clock generator circuit within time other than a working period of the pulse wave of the high-side pulse enable signal is equal to a first reference frequency;

wherein the frequency of the clock signal that is outputted by the clock generator circuit within the working period of the pulse wave of the high-side pulse enable signal is equal to a second reference frequency;
wherein the second reference frequency is higher than the first reference frequency.

6. The power converter according to claim 1, wherein the charge pump includes:
a first capacitor, wherein a first terminal of the first capacitor is connected to the input voltage source and the high-side driver circuit, and a second terminal of the first capacitor is grounded.

7. The power converter according to claim 6, wherein the charge pump further includes:
a second capacitor, wherein a first terminal of the second capacitor is connected to the input voltage source, and a second terminal of the second capacitor is connected to the first terminal of the first capacitor.

8. The power converter according to claim 7, wherein the charge pump further includes:
a first switch component, wherein a first terminal of the first switch component is connected to the input voltage source, a second terminal of the first switch component is connected to the first terminal of the second capacitor, and a control terminal of the first switch component is connected to an output terminal of the clock generator circuit.

9. The power converter according to claim 8, wherein the charge pump further includes:
a second switch component, wherein a first terminal of the second switch component is connected to the second terminal of the second capacitor, a second terminal of the second switch component is connected to the first terminal of the first capacitor, and a control terminal of the second switch component is connected to the output terminal of the clock generator circuit.

10. The power converter according to claim 9, wherein the charge pump further includes:
a third switch component, wherein a first terminal of the third switch component is connected to the input voltage source, a second terminal of the third switch component is connected to the second terminal of the second capacitor, and a control terminal of the third switch component is connected to the output terminal of the clock generator circuit.

11. The power converter according to claim 10, wherein the charge pump further includes:
a fourth switch component, wherein a first terminal of the fourth switch component is connected to the first terminal of the second capacitor, a second terminal of the fourth switch component is coupled to a reference voltage, and a control terminal of the fourth switch component is connected to the output terminal of the clock generator circuit.

* * * * *